(12) United States Patent
Mays et al.

(10) Patent No.: US 6,898,065 B2
(45) Date of Patent: May 24, 2005

(54) METHOD AND APPARATUS FOR OPERATING AN ELECTROSTATIC CHUCK IN A SEMICONDUCTOR SUBSTRATE PROCESSING SYSTEM

(76) Inventors: Brad Mays, 2523 Blue Rock Ct., San Jose, CA (US) 95133; Tetsuya Ishikawa, 20072 Kilbride Dr., Saratoga, CA (US) 95070; Sergio Fukuda Shoji, 6254 Culvert Dr., San Jose, CA (US) 95123

( * ) Notice: Subject to any disclaimer, the term of this patent is extended or adjusted under 35 U.S.C. 154(b) by 154 days.

(21) Appl. No.: 10/205,991

(22) Filed: Jul. 26, 2002

(65) Prior Publication Data

US 2004/0016405 A1 Jan. 29, 2004

(51) Int. Cl.[7] ............................................. H01T 23/00
(52) U.S. Cl. ........................................................ 361/234
(58) Field of Search ........................ 361/234; 427/535; 438/14

(56) References Cited

U.S. PATENT DOCUMENTS

| | | | |
|---|---|---|---|
| 5,684,669 A | * 11/1997 | Collins | 361/234 |
| 5,835,333 A | 11/1998 | Castro et al. | 361/234 |
| 5,835,335 A | 11/1998 | Ross et al. | 361/234 |
| 5,838,529 A | 11/1998 | Shufflebotham et al. | 361/234 |
| 5,933,314 A | 8/1999 | Lambson et al. | 361/234 |
| 5,997,962 A | * 12/1999 | Ogasawara | 427/535 |
| 6,033,482 A | 3/2000 | Parkhe | 118/728 |
| 6,169,652 B1 | 1/2001 | Klebanoff | 361/234 |
| 6,198,616 B1 | * 3/2001 | Dahimene et al. | 361/234 |
| 6,246,567 B1 | 6/2001 | Parkhe | 361/234 |
| 6,304,424 B1 | 10/2001 | Mett et al. | 361/234 |

* cited by examiner

*Primary Examiner*—John F. Niebling
*Assistant Examiner*—Andre' Stevenson
(74) *Attorney, Agent, or Firm*—Joseph Bach; Moser, Patterson & Sheridan LLP

(57) ABSTRACT

A method and apparatus for a mixed-mode operation of an electrostatic chuck in a semiconductor substrate processing system. The chuck is operated in a voltage mode before and after a processing and is operated in a current mode during the processing to suppress arcing during the processing of a substrate.

7 Claims, 7 Drawing Sheets

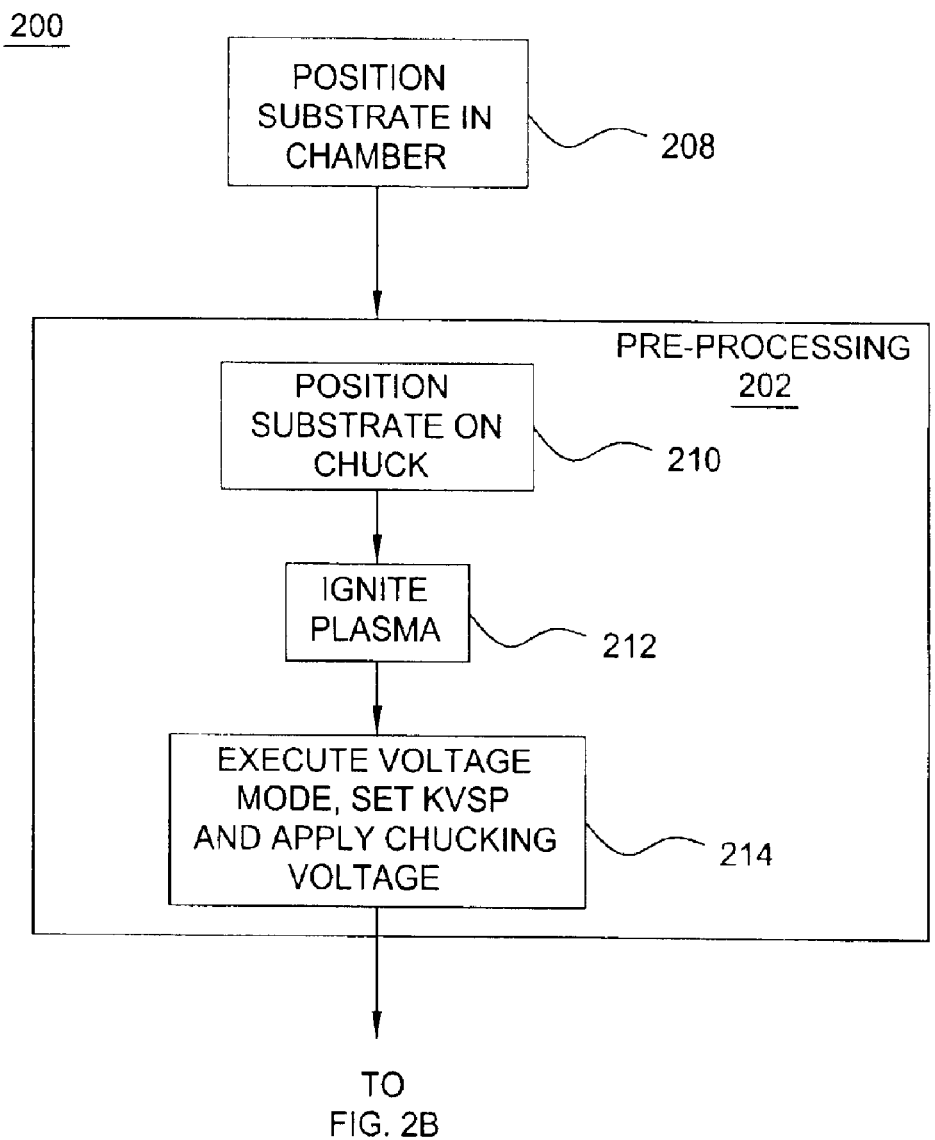
FIG. 2A
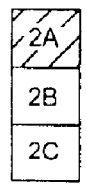

METHOD AND APPARATUS FOR OPERATING AN ELECTROSTATIC CHUCK IN A SEMICONDUCTOR SUBSTRATE PROCESSING SYSTEM

BACKGROUND OF THE DISCLOSURE

1. Field of the Invention

The invention generally relates to semiconductor substrate processing systems. More specifically, the invention relates to a method and apparatus for chucking and dechucking a substrate to/from an electrostatic chuck used in a semiconductor substrate processing system.

2. Description of the Background Art

During the manufacture of semiconductor devices, electrostatic chucks provide more uniform clamping and better utilization of the surface of a substrate than mechanical chucks. Electrostatic chucks also can operate in vacuum chambers where the vacuum chucks cannot be used. As such, electrostatic chucks have found wide use in semiconductor substrate processing systems.

Operation of an electrostatic chuck is based on a well-known principle of creating a clamping force-between the biased electrostatic chuck and a substrate (also referred to as a wafer).

Generally, there are two basic configurations of an electrostatic chuck differentiated by the number of the electrodes—unipolar, or monopolar, chucks with one electrode and bipolar chucks with two electrodes. In either configuration, the electrodes are located in proximity to the surface that supports a substrate and embedded in or coated with a dielectric material such as polyimide, alumina, aluminum-nitride and the like.

When electrically biased, these electrodes polarize the material of a substrate and develop a clamping force between the electrostatic chuck and the substrate. Typically, a DC voltage is used in an electrostatic chuck for clamping the substrates during plasma processing. However, AC voltage chucks are known in the art.

A unipolar electrostatic chuck utilizes a plasma or an electrical contact to the substrate to complete a return path for the source of electrical bias, while a bipolar chuck needs only a differential voltage applied across the electrodes to create the clamping force and can operate in a non-plasma environment. In general, the DC voltage employed in an electrostatic chuck is quite high and may reach 700–1500V, however, voltage in a 200–700V range is more common.

When an electrostatic chuck is used in a plasma enhanced semiconductor wafer processing system such as an etch chamber, a physical vapor deposition (PVD) chamber, or a plasma enhanced chemical vapor deposition (PECVD) chamber, or a reactive ion etch (RIE) chamber, the electrode(s) of the chuck draw current from the plasma or source current to the plasma depending on the polarity of the chucking voltage. Such current draw may not be uniform across the wafer and may result in wafer arcing and/or arcing between chamber components. Such arcing may fatally damage the sensitive features on the processed substrates and damage the processing system components.

Therefore, there is a need in the art for a method and apparatus for chucking and dechucking substrates that reduces chamber/wafer arcing.

SUMMARY OF THE INVENTION

The present invention is a method and apparatus for chucking and dechucking substrates using a mixed-mode operation of an electrostatic chuck. Specifically, the chuck is operated in a current mode during substrate processing and in a voltage mode—prior to and after substrate processing. In one embodiment of the invention, where the invention is used in a plasma enhanced substrate processing system, during the current mode, the clamping current is set to a level optimized for suppression of arcing and for securely clamping the substrate to the electrostatic chuck. The voltage mode is used to securely retain the wafer prior to plasma processing and to dechuck the wafer after plasma processing.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIGS. 2a, 2b and 2c depict a flow diagram for the mixed-mode operation of an electrostatic chuck in accordance with an example of one embodiment of the invention.

DETAILED DESCRIPTION

Figure 1:
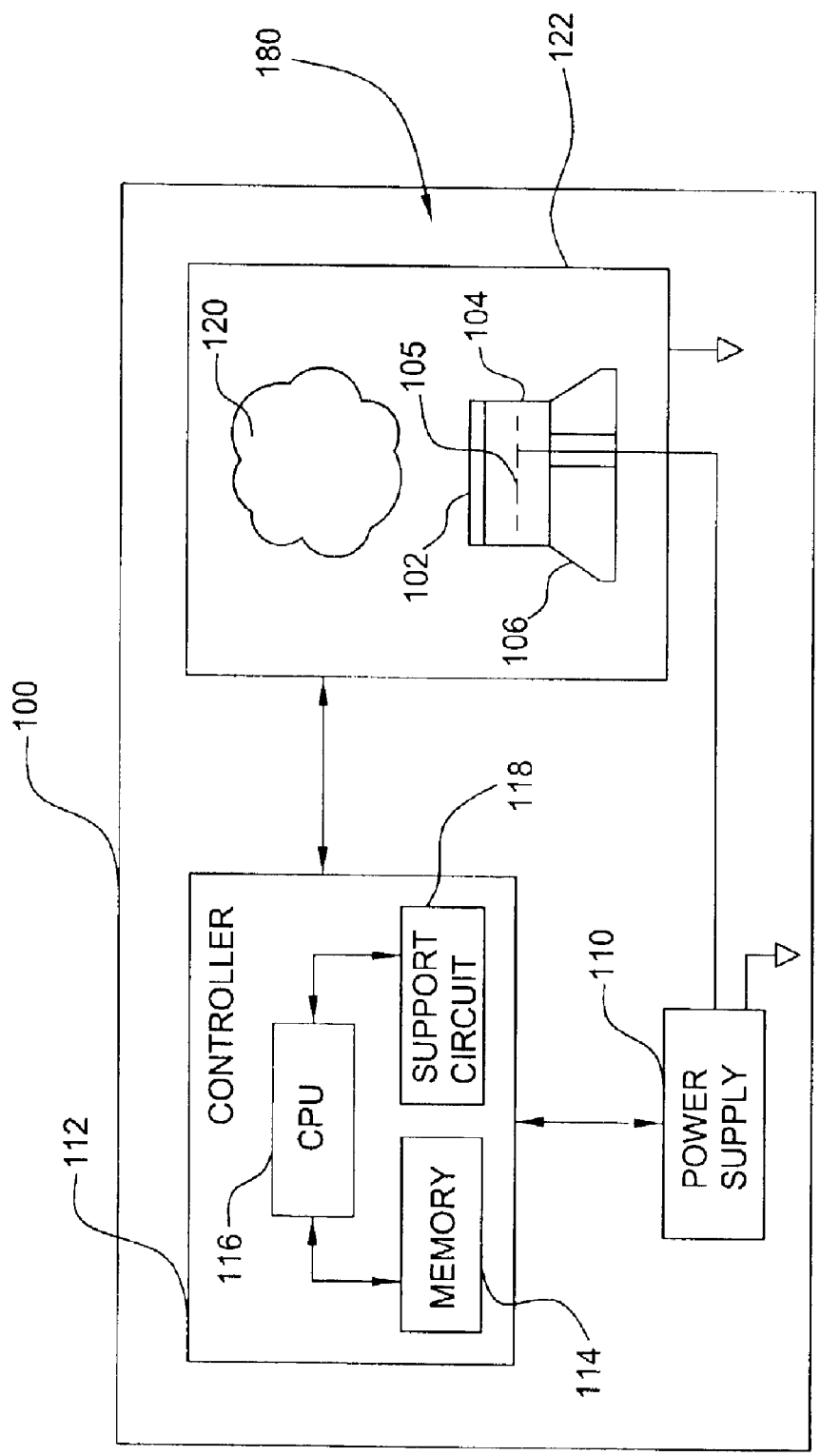
FIG. 1 depicts a schematic diagram of semiconductor substrate processing system having an electrostatic chuck.

FIG. 1 depicts a schematic diagram of semiconductor substrate processing system 100 comprising a controller 112, a chamber 108 with an electrostatic chuck 104, and a clamping power supply 110.

A controller 112 comprises a central processing unit (CPU) 116, a memory 114, and support circuits 118 for the CPU 116 and coupled to the various components of the system 100. To facilitate control of the chamber 108 the CPU 116 may be one of any form of general purpose computer processor that can be used in an industrial set point for controlling various chambers and subprocessors. The memory 114 is coupled to the CPU 116. The memory 114, or computer-readable medium, may be one or more of readily available memory such as random access memory (RAM), read only memory (ROM), floppy disk, hard disk, or any other form of digital storage, local or remote. The support circuits 118 are coupled to the CPU 116 for supporting the processor in a conventional manner. These circuits include cache, power supplies, clock circuits, input/output circuitry and subsystems, and the like.

A substrate 102 is placed on and removed from the chuck 104 by a robotic arm (not shown) of the system 100. The chamber 108 may be used for plasma enhanced processes or non-plasma enhanced processes. Such processes include but are not limited to PVD, PECVD, thermal CVD, RIE, ion implantation, and related processes used to manufacture thin films for very large scale integration (VLSI) semiconductor devices, computer and optical media, opto-electronics, micro-electronic mechanical systems (MEMS), and the like.

The chuck 104 is generally a part of a substrate pedestal 106, which may also be adapted for conditioning and treatment of the substrate 102 such as cooling and heating by various means including backside gas, embedded heater, infrared radiation, and the like. Substrate 102 may also be treated in the chamber 108 by various non-plasma processes (irradiation by ultra violet and infrared light, heat treatments, annealing, and the like) in addition to plasma processing.

The pedestal 106 and other elements of the chamber 108 like powered electrodes, internal and external inductive coils, sputtering targets, shields, and the like may be electrically biased by the power supplies (not shown) of the system 100 operating in DC, AC and RF/microwave bands. Plasma may also be introduced to the chamber 108 from a remote source in the form of an ionized gas.

The chuck 104 comprises one or more electrodes 105 that are operated by the power supply 110. Generally, the power supply 110 is a controlled high voltage DC power supply that serves as a programmable source of the clamping voltages and clamping currents for the chuck 104. These clamping voltages and clamping currents are administered and monitored in real time by the controller 112 of the system 100 during processing of the substrate 102.

In one embodiment of the invention, the chamber 108 is an etch chamber such as the MxP, MxP+, eMxP, super e, and eMAX etch chambers manufactured by Applied Materials, Inc. of Santa Clara, Calif. In such an embodiment, the electrostatic chuck 104 comprises a single electrode 105 (known as a unipolar chuck) that is coupled to the power supply 110. The return current path for the applied chucking voltage is through a plasma 120 to the grounded chamber walls 122. Alternatively, a bipolar chuck may be used, wherein a differential voltage is applied to a pair of electrodes to achieve chucking without a plasma forming a return current path.

The power supply 110 is adapted for operation in voltage and current modes and to transition between the modes without interruption of the output and without abrupt changes or transients of the output clamping voltages and clamping currents. A power supply capable of such operation is disclosed in U.S. Pat. No. 6,304,424 "Method and Apparatus for Minimizing Plasma Destabilization Within a Semiconductor Wafer Processing System", issued Oct. 16, 2001 and incorporated herein by reference in its entirety.

A program that controls the operation of the power supply 110 is administered by either the controller 112 or, in some cases, by a local controller (not shown) of the chamber 108 or by a CPU (not shown) that is remotely located from the hardware being controlled by the CPU 116. The program generally utilizes data collected during the pre-production characterization testing of the system 100, the chamber 108, the power supply 110, and the chuck 104.

The chamber 108, the system 100, the power supply 110 and the chuck 104 are tested and characterized prior to processing of the product substrates. An important part of these tests relates to determination of the chuck voltage and chuck current needed to securely retain the substrate 102 on the chuck 104 during processing and to achieve consistent and reliable dechucking of the substrate 102 after processing.

In addition to these tests, the correlation between chuck current (also referred to herein as the clamping current) and the potential for arcing in the chamber 108 is monitored to determine a chuck current limit $I_1$ for optimal suppression of arcing. The limitation of chuck current must be balanced with the need to securely clamp the substrate to the chuck 104. The current limit parameter $I_1$ corresponds to a nominal current value between 25 and 250 $\mu A$ and, specifically, has a nominal value 100 $\mu A$. The current limit parameter represents an amount of chuck current that, if left unchanged, may result in arcing. As such, the chuck current should be maintained at or below this current limit.

The voltage applied to the chuck (referred to herein as the chuck voltage or clamping voltage) is monitored along with chuck current to assure that the requirement for securely clamping the substrate is satisfied. More specifically, to ensure substrate retention, the clamping voltage should be equal or greater than a threshold $V_1 = V_{min} + V_s$, where $V_{min}$ is the minimal specified clamping voltage that is required to retain the wafer and $V_s$ is a safety margin. Typically, margin $V_s$ has a value between 0 (zero) to a fraction of the voltage $V_{min}$, depending upon a design of the system 100, the chamber 108, the power supply 110, and the chuck 104.

A mode of operation of the power supply 110, in general terms, results from either a hardware configuration or a software program or a combination thereof that provide a specific control algorithm.

In the voltage mode, a clamping voltage of the power supply 110 is set at a level corresponding to a voltage set point KVSP, while the clamping current may vary. Accordingly, in the current mode, the clamping current of the power supply 110 is stabilized at a level corresponding to the current limit $I_1$, while a clamping voltage may vary. The controller 112 communicates the set point KVSP to the power supply and selects the mode of operation for the power supply 110.

Figure 2B:
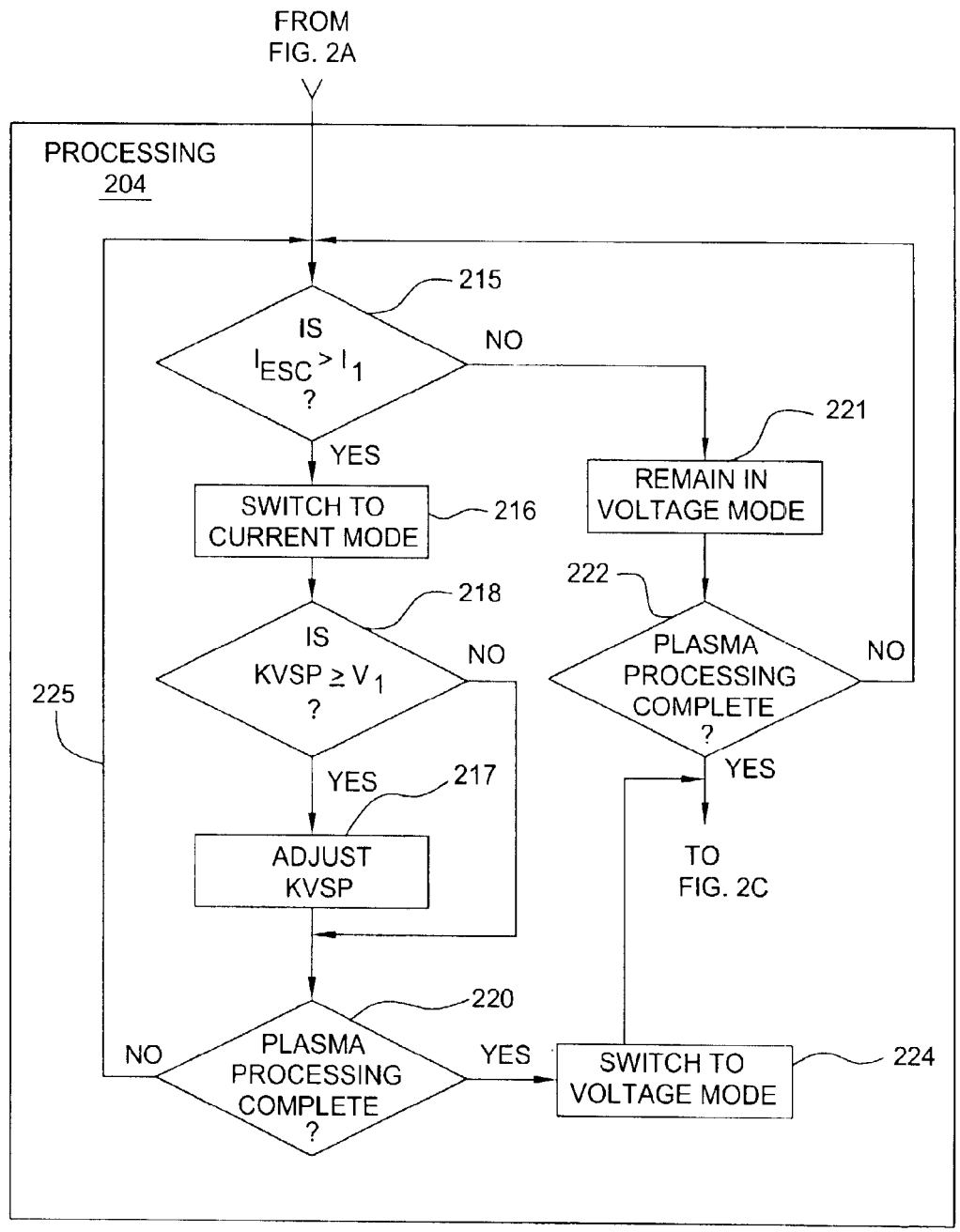
Figure 2C:
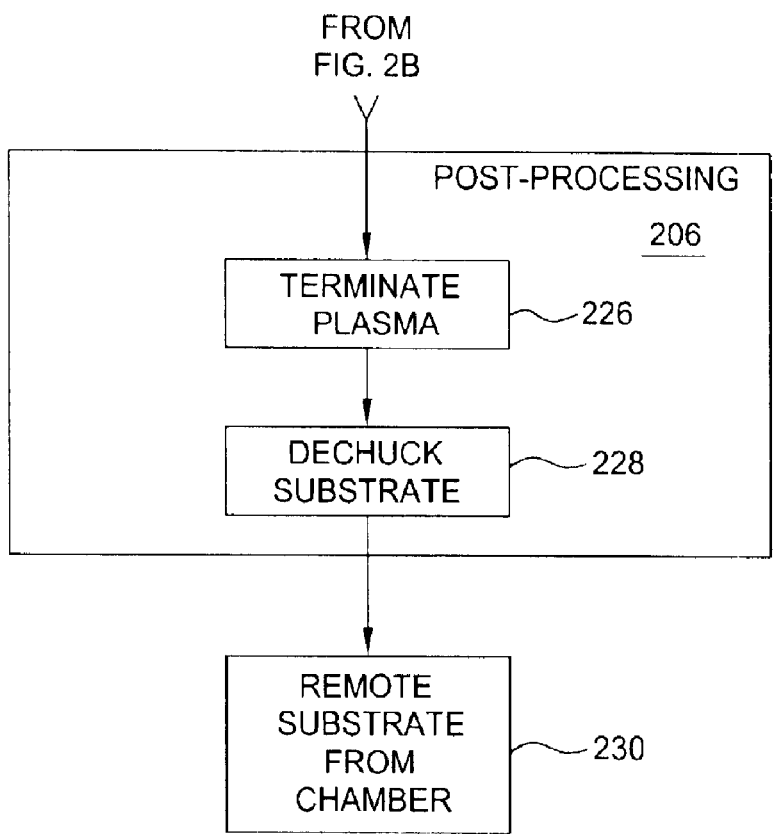
Figure 2C:
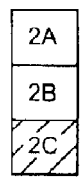

A typical process cycle for the chamber 108 is depicted as a flow diagram in FIGS. 2a, 2b and 2c. FIG. 2 depicts the arrangement of FIGS. 2a, 2b and 2c. To best understand the invention, FIGS. 2a, 2b and 2c should be viewed simultaneously. The process 200 comprises a pre-processing step 202, a processing step 204, a post-processing step 206, and transportation steps 208 and 230. A software program is generally stored in the memory 114 that, when executed by the controller, causes the system 100 to operate in accordance with process 200. The program may also be stored and/or executed by a local controller (not shown) of the chamber 108 or by a CPU (not shown) that is remotely located from the hardware being controlled by the CPU 116.

The software, when executed by the CPU 116, transforms the general purpose computer into a specific purpose computer (controller) 112 that controls operation of the chamber 108 such that the process 200 is performed. Although the process of the present invention is discussed as being implemented as a software routine, some of the method steps that are disclosed therein may be performed in hardware as well as by the software controller. As such, the invention may be implemented in software as executed upon a computer system, in hardware as an application specific integrated circuit or other type of hardware implementation, or a combination of software and hardware.

In one embodiment of the present invention, the process 200 begins at step 208 where a substrate is moved by a robot into the chamber 108.

The pre-processing step 202 comprises steps 210, 212, and 214. At step 210, a substrate is placed on the chuck. At step 212, the plasma is ignited and stabilized. At step 214, the chuck electrode or electrodes are energized to clamp and retain the substrate on the chuck. To clamp the substrate, the chuck 104 is operated in the voltage mode by applying voltage $V_1$ or greater. Output voltage $V_1$ or greater is established by setting a high voltage set point (KVSP) within the power supply. KVSP is generally controlled by the software.

The processing step 204 comprises steps 215–225. At step 215, the method 204 queries whether the current ($I_{ESC}$) to the electrostatic chuck is greater than a current limit parameter ($I_1$). If the current to the chuck is not greater than $I_1$, then the query is negatively answered and the method proceeds to step 221. In step 221, the power supply remains in the voltage mode with the applied voltage set by the parameter KVSP. KVSP is set to a level greater than $V_f$ to produce a chuck voltage that will retain the substrate. The method then queries whether the plasma processing is complete at step 222. If the plasma processing is not complete, the routine proceeds to step 215 to again analyze whether the current to the electrostatic chuck is greater than the limit parameter $I_1$. If, at step 222, the plasma processing is found to be complete, the method proceeds to the post-processing step 206 of FIG. 2c.

If, at step 215, the current to the electrostatic chuck is found to be greater than the current limit $I_1$, the method switches to the current mode at step 216. At step 218, the method queries whether KVSP (or the chuck voltage) is less than a lower limit of $V_1$. As discussed above, $V_1$ represents a chucking voltage which is the minimum voltage plus the safety margin that can be applied to the electrostatic chuck and retain the substrate upon the chuck with any confidence. If the chucking voltage is less than $V_1$, at step 218 the process proceeds to step 220. If $V_1$ has not yet been reached, the parameter KVSP is adjusted (reduced) in a stepwise manner to lower the current being supplied to the electrostatic chuck, at step 217. In other words the voltage applied to the chuck is reduced to reduce the chuck current. Other electronic techniques could be used to adjust (reduce) the current being delivered to the chuck. The KVSP step adjustment minimum size is selected to not cause accidental de-chucking of the substrate during the adjustment. The maximum step adjustment corresponds to a nominal value between 10v to 500v and, specifically has a nominal value of 100v. Then the method queries at step 220, whether plasma processing of the substrate is complete. If the plasma processing is not complete, the routine proceeds to step 215 along path 225, to again analyze whether the current to the electrostatic chuck is greater than the limit parameter $I_1$. The process steps of 215, 217, and 218 are continued until either the KVSP is less than $V_1$ or the plasma processing is found to be complete. Upon plasma processing being completed at step 220, the method proceeds to step 224, wherein the power supply is switched to voltage mode. Thereafter, the method proceeds to post-processing method step 206.

The post-processing step 206 comprises steps 226 and 228. At step 226, the plasma is terminated. At step 228, the chuck electrode or electrodes are de-energized and a dechucking voltage is applied to dechuck or declamp, the substrate.

At transportation step 230, a robot removes the substrate from the chamber 108.

The steps 202, 204, and 206 may include optional steps of non-plasma processing of the substrate such as substrate heating or cooling, substrate orientation or positioning, and the like. Such optional steps may be performed during any time interval while the substrate is located in the chamber 108 and are well known in the art and vary from chamber-to-chamber and process-to-process.

Step 204 may include optional steps of plasma processing of the substrate, in which KVSP can be reapplied as step 214, or could use an already adjusted KVSP as step 217, from a previous plasma processing. The consecutive plasma steps are known in the art as back-to-back plasma processing.

Figure 3:
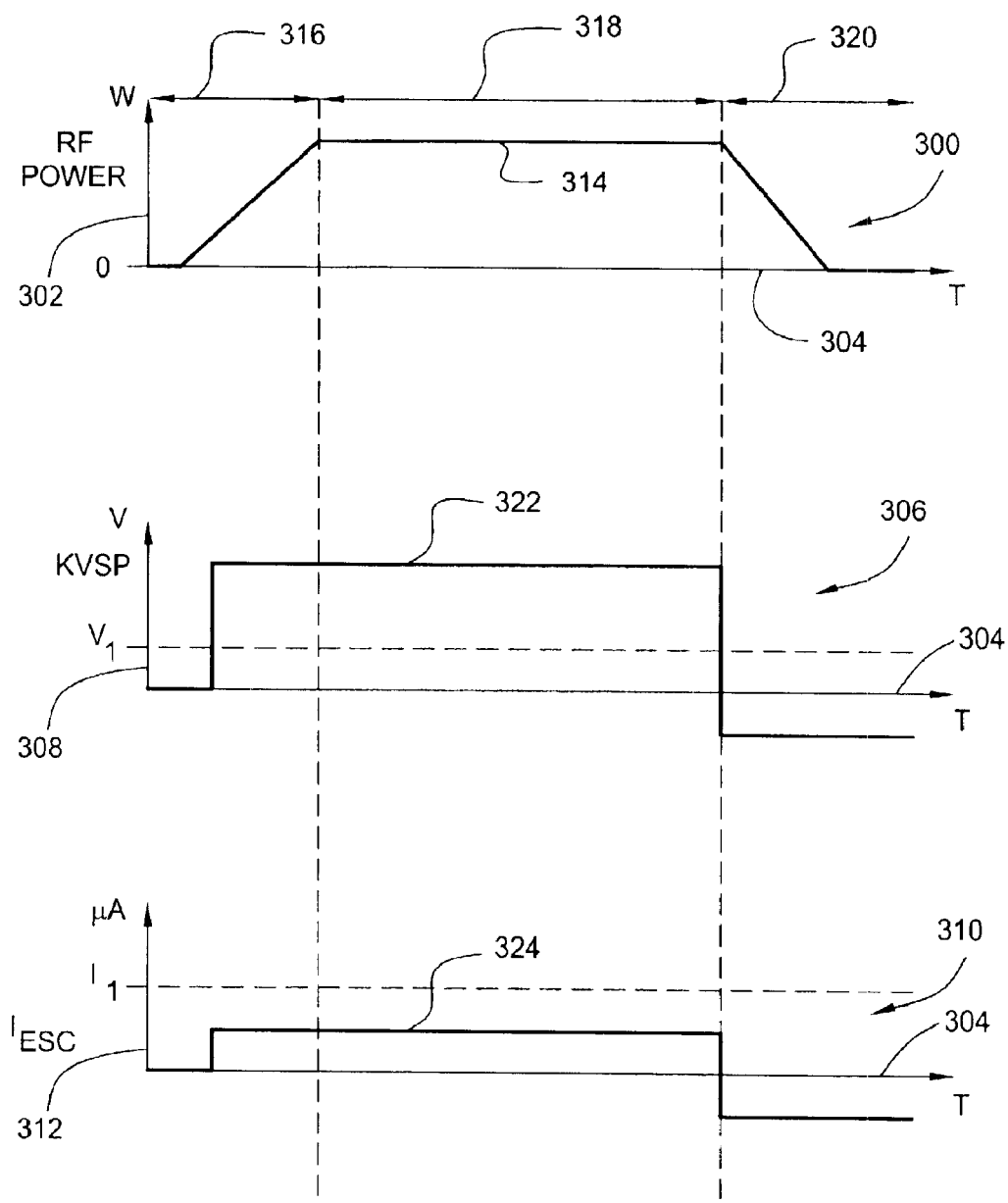
FIGS. 3, 4 and 5 depict exemplary timing diagrams of the mixed-mode operation of an electrostatic chuck in accordance with one embodiment of the invention.
Figure 4:
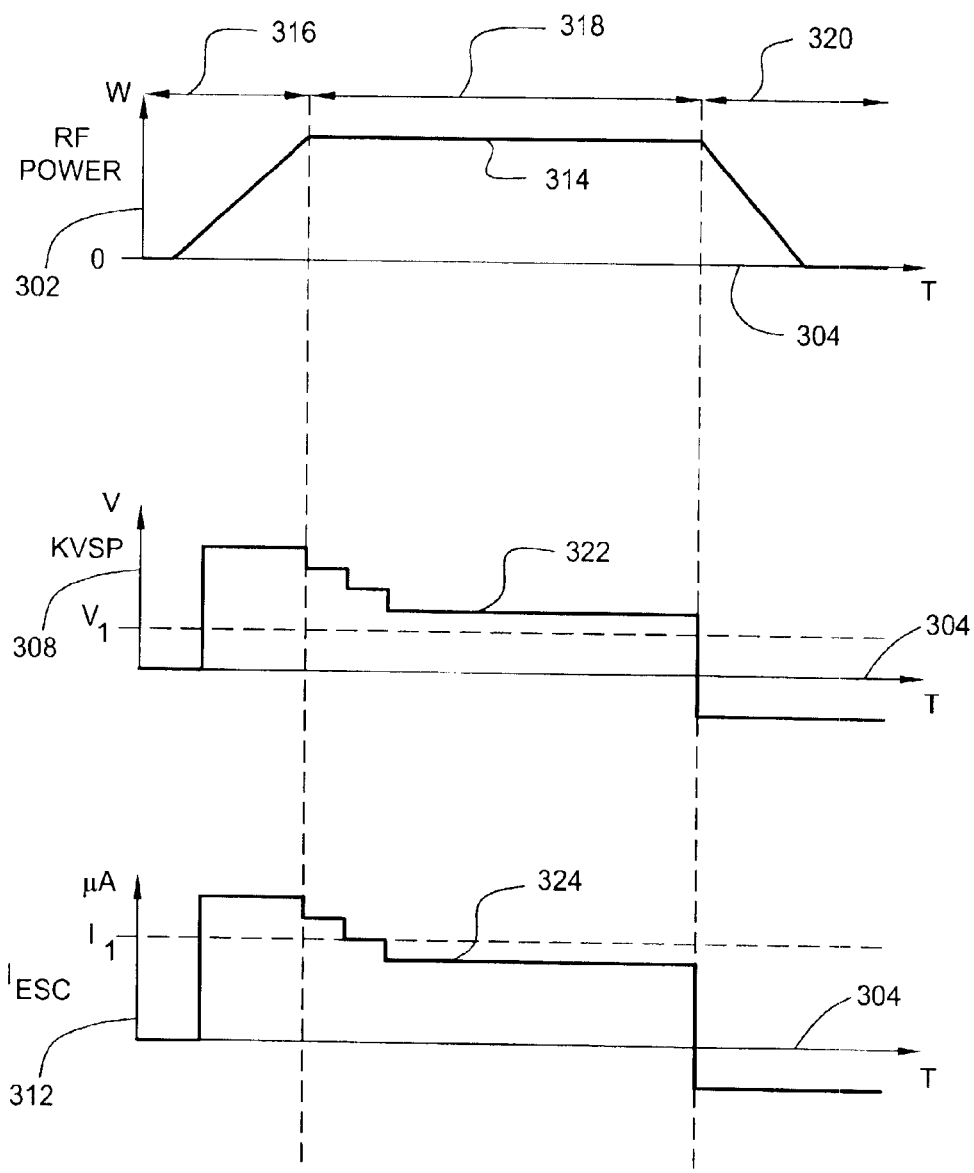
Figure 5:
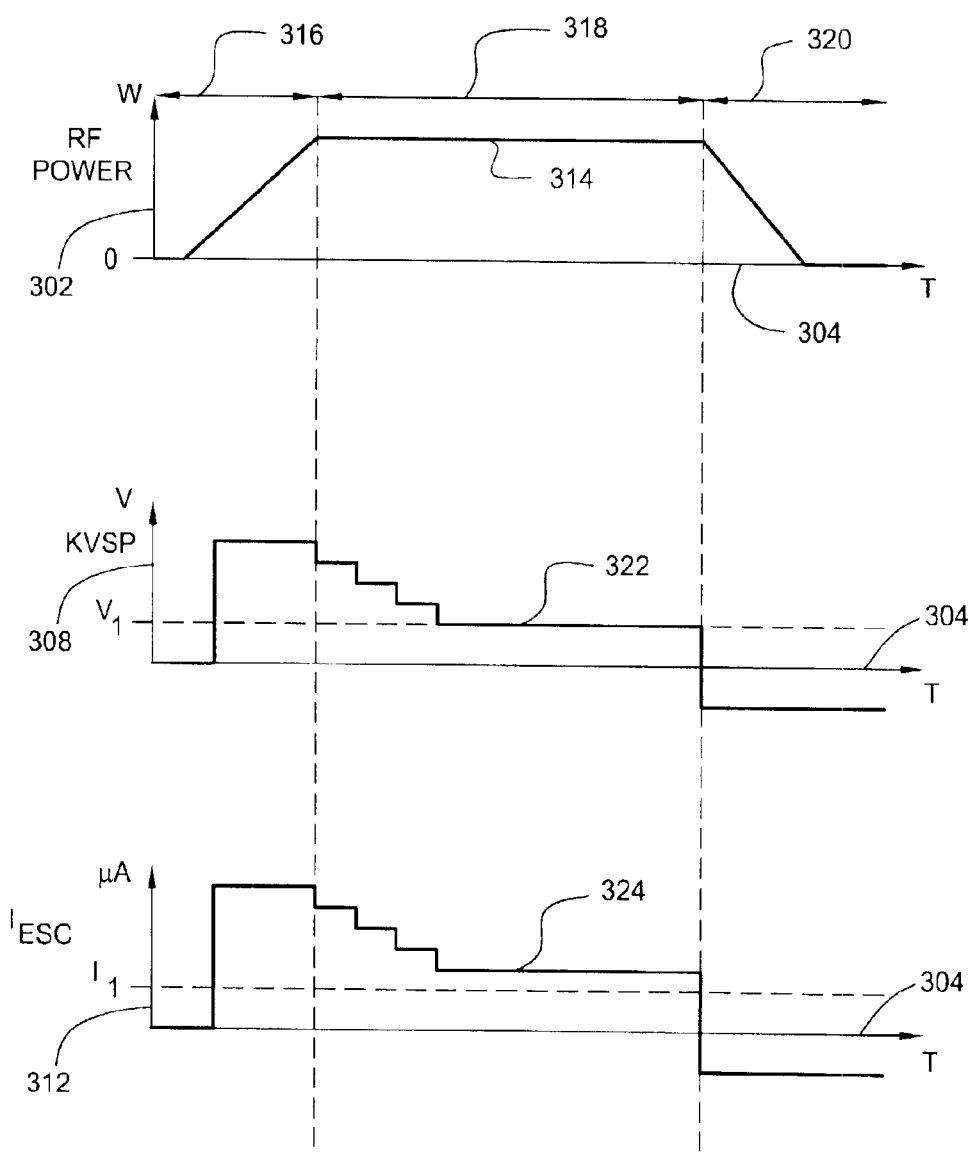

FIGS. 3, 4 and 5 depict graphs of electric signals as applied to the chamber 108 of FIG. 1 to facilitate operation of the power supply and electrostatic chuck in accordance with one example of the present invention. As described above with respect to FIG. 2, the invention operates by having the power supply operate in either a voltage mode or a current mode. Three scenarios of operation are described within the context of FIG. 2. The first scenario occurs when the current to the electrostatic chuck does not obtain a level greater than or equal to the current limit parameter $I_1$ and the chuck operates in a voltage mode throughout the processing of a wafer. In a second scenario, the electrostatic chuck current exceeds the current limit parameter $I_1$ and the power supply operates in a current mode during wafer processing whereby the current is adjusted to attain a level below the current limit $I_1$. In a third scenario of operation, the electrostatic chuck current exceeds the current limit parameter $I_1$ causing the power supply to operate in the current mode whereby the voltage control level is reduced to a level that is equal to a minimum chucking voltage without resulting in the electrostatic chuck current falling below the current limit $I_1$. In this third scenario, the power supply voltage is held at a minimum chucking voltage that will maintain the substrate upon the chuck.

FIG. 3 depicts the electrical signals of the first scenario. The graph 300 depicts RF power (axis 302) versus time (axis 304), the graph 306 depicts the KVSP parameter (axis 308), which corresponds to chucking voltage, versus time (axis 304) and the graph 310 depicts the chuck current ($I_{ESC}$)(axis 312) versus time (axis 304). In graph 300, RF power 314 is applied during a first period 316, the substrate is processed with a plasma during period 318, and, when the wafer requires dechucking, the plasma is terminated in period 320. To chuck the substrate, the voltage control parameter KVSP 322 is applied at a steady state during both periods 316 and 318 and at a dechucking level during period 320. In this first scenario, the electrostatic chuck current 324 of graph 310 is constant during the periods 316 and 318 and never attains a value greater than the current limit $I_1$. As such, the current mode is not triggered and the power supply operates in the voltage mode whereby the voltage is held constant for both period 316 and period 320.

FIG. 4 depicts the electrical signals of the second scenario where the RF power 314 is applied as in FIG. 3 but in this scenario the power supply control parameter KVSP 322 is supplied during period 316 in the voltage mode. Once the plasma is produced with the RF power at a steady state, the chucking current 324 is sensed as exceeding the current limit $I_1$. The power supply is then switched to a current mode in period 318 whereby the voltage control parameter KVSP 322 is incrementally decreased from the initial value in a stepwise manner to a lower value until the electrostatic chuck current 324 is less than the current limit $I_1$. At that point, the chucking voltage control parameter KVSP 322 is held constant (to produce a constant chucking voltage) until the plasma process is completed. Upon completion of the plasma process, the power supply is switched back to a voltage mode for dechucking of the wafer (i.e., in period 320).

In the third scenario shown in FIG. 5, the value KVSP 322 is decreased in period 318 when the electrostatic chuck current 324 exceeds the current limit $I_1$. The power supply enters the current mode as in the second scenario and the voltage control parameter KVSP 322 is incrementally reduced in an attempt to lower the electrostatic chuck current 324 below the current limit $I_1$. However, in this scenario, the parameter KVSP 322 attains a value that is less than the minimum chucking voltage $V_1$ that can be used to safely chuck a substrate to the electrostatic chuck without the substrate being dislodged from the chuck surface. When this level is obtained, the controller does not reduce the parameter KVSP 322' any lower and the electrostatic chuck current 324 remains constant although greater than the current limit $I_1$. The substrate is dechucked during period 320.

The foregoing process and apparatus may be used with either a uni-polar chuck or a bipolar chuck. For a bipolar chuck, KVSP controls the differential voltage applied across a pair of electrodes.

Although various embodiments, which incorporate the teachings of the present invention, have been shown and described in detail, those skilled in the art can readily devise many other varied embodiments that still incorporate these teachings.

What is claimed is:

1. A method of operating an electrostatic chuck, comprising:

applying a controlled first voltage to said electrostatic chuck prior to processing a substrate;

determining if a current produced by the first voltage is greater than a current limit;

if the current is less than or equal to the current limit, maintaining the first voltage during substrate processing;

if the current is greater than the current limit, adjusting the current until the current is less than or equal to the current limit; and applying a controlled second voltage to said electrostatic chuck after processing of the substrate.

2. The method of claim 1, wherein the processing is plasma processing.

3. The method of claim 1, wherein said electrostatic chuck is a bipolar electrostatic chuck.

4. The method of claim 1, wherein said electrostatic chuck is a unipolar electrostatic chuck.

5. The method of claim 1, wherein values of the controlled first voltage, the controlled second voltage, and the controlled current are defined prior to processing of the substrate.

6. The method of claim 1 further comprising determining whether, during current adjustment, the first voltage obtains a predefined limit;

if the first voltage is less than the predefined level, stop adjusting the current.

7. The method of claim 1, wherein adjusting the current suppresses arcing during processing of the substrate.

* * * * *